United States Patent [19]
Settles et al.

[11] Patent Number: 5,761,047
[45] Date of Patent: Jun. 2, 1998

[54] RETAINING SUPPORT FOR ELECTRICAL ASSEMBLY HAVING RIBS EXTENDING FROM HOUSING

[75] Inventors: Steven Settles, Sterling Heights; Jennifer Wever, Farmington Hills, both of Mich.

[73] Assignee: UT Automotive Dearborn, Inc., Dearborn, Mich.

[21] Appl. No.: 654,560

[22] Filed: May 29, 1996

[51] Int. Cl.⁶ ........................................ H05K 5/00
[52] U.S. Cl. .................. 361/752; 361/785; 361/801; 439/76.1; 439/609; 174/356
[58] Field of Search ........................ 361/684, 728, 361/736, 752, 760, 755, 785, 759, 796, 801, 802, 808; 174/35 C, 35 GC; 439/607, 76.1, 608, 609, 610

[56] References Cited

U.S. PATENT DOCUMENTS

| | | | |
|---|---|---|---|
| 5,013,262 | 5/1991 | Shibano | 439/610 |
| 5,111,362 | 5/1992 | Flamm et al. | 361/736 |
| 5,273,459 | 12/1993 | Davis | 439/607 |
| 5,364,280 | 11/1994 | Colleran | 439/76 |
| 5,392,197 | 2/1995 | Cuntz et al. | 361/818 |
| 5,473,109 | 12/1995 | Plankl et al. | 175/35 C |
| 5,515,240 | 5/1996 | Rodeffer et al. | 361/759 |

FOREIGN PATENT DOCUMENTS 4447513  1/1996  Germany.

Primary Examiner—Kristine L. Kincaid
Assistant Examiner—Anthony Dinkins
Attorney, Agent, or Firm—Howard & Howard

[57] ABSTRACT

An electrical assembly having a first member and a second member which form a housing for a circuit board. At least one rib extends from an inner face of the first member. The connector assembly also includes an electrical connector disposed in the housing having at least one contact arm contacting the circuit board. The rib contacts the connector and urges the connector against the circuit board. With this invention there is no need to heat stake or otherwise secure the connector to the board.

19 Claims, 1 Drawing Sheet

5,761,047

RETAINING SUPPORT FOR ELECTRICAL ASSEMBLY HAVING RIBS EXTENDING FROM HOUSING

BACKGROUND OF THE INVENTION

The present invention generally relates to an electrical housing assembly which simplifies attachment of electrical components to a circuit board.

Several electrical connection assemblies are used in modern vehicles. These assemblies connect electrical controls and signals between components, controls and circuit boards.

In one known assembly, an electrical connector has a plurality of contact arms soldered to a printed circuit board housed in the assembly. A mating electrical connection is plugged into the electrical connector through an opening in the housing and an insertion force is transferred to the electrical connector. This insertion force causes stress on the solder joints between the contact arms and the circuit board. Such stress may cause the circuit board to crack or the contact arms to lose contact with the circuit board. This may cause a failure in the electrical connection between the electrical components.

To address this problem, the known art has provided fastening structure between the circuit board and the electrical connector. Such structure include screws, rivets and heat stakings. Although the fastening structure may reduce the stress on the solder joints, it increases time and cost for manufacturing the electrical assemblies.

Thus, the known art has not successfully addressed this problem. Accordingly, there remains a need for a cost-effective electrical connector assembly which reduces the stress on the solder joints between an electrical connector and a circuit board.

SUMMARY OF THE INVENTION

The present invention provides an improved retaining support for an electrical component and a circuit board. The assembly comprises a first member with at least one rib extending from an inner face, and a second member. The first and second members are attached to each other and form a housing. A circuit board is disposed adjacent a base of the second member. The assembly includes an electrical component disposed in the housing between the first and second members. The component has at least one contact arm contacting the circuit board, and preferably soldered to the circuit board. The component preferably includes a tab which extends from a main body of the connector into a hole in the circuit board. The rib contacts and urges the components against the circuit board.

The component is preferably an electrical connector. When a mating electrical connector is inserted into the electrical connector, an insertion force is applied to the electrical component. The ribs support the electrical connector against this insertion force and prevent undue stress on the contact arms. In a preferred embodiment of this invention, a set of two ribs extend from the inner face of the first member. A first rib contacts an upper face of the connector and a second rib contacts a side face of the connector, preferably at a corner. The second rib provides a stop for the connector and negate stress on the contact arms due to the insertion forces.

Preferably, the first and second members each have a flange wherein the flanges collectively define an opening through which the mating electrical connector is plugged into the connector. The connector abuts the second member flange and the circuit board, and the rib urges the connector against the circuit board and the second member flange.

These and other features of the present invention will be best understood from the following specification and drawings, of which the following is a brief description.

DETAILED DESCRIPTION OF A PREFERRED EMBODIMENT OF THE INVENTION

Figure 1:
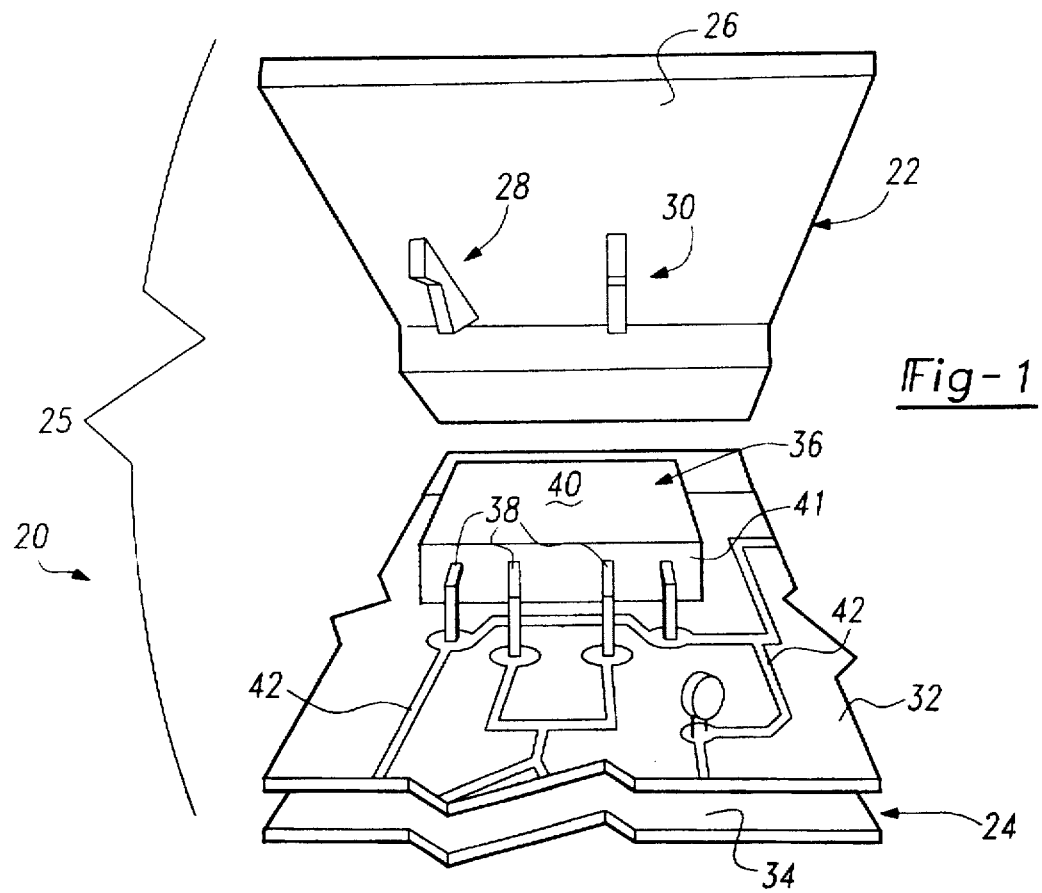
FIG. 1 is a partial, exploded, perspective view of a connector assembly according to the present invention.

An electrical assembly according to the present invention is generally shown at 20. Assembly 20 includes a first member 22 and a second member 24 which attach to each other to form a housing 25. First member 22 has an inner face 26 from which extend two sets of ribs 28, 30. First and second members are attached in a conventional manner such as by snaps or clasps (not shown). A circuit board 32 is disposed in housing 25, preferably adjacent a base 34 of second member 24.

Assembly 20 also includes an electrical connector 36 which is disposed in housing 25 between first member 22 and second member 24. Connector 36 has a plurality of contact arms 38 which extend from main body 40 of connector 36 and contact circuit board 32. In particular, contact arms 38 extend from a rear face 41 of connector 36, bend 90° and extend downwardly to circuit board 32. Contact arms 38 make electrical contact with circuit traces 42, by passing through holes 43 in circuit board 32. Contact arms 38 may be soldered to circuit board 32 using a soldering compound 44 (see FIG. 2).

Figure 2:
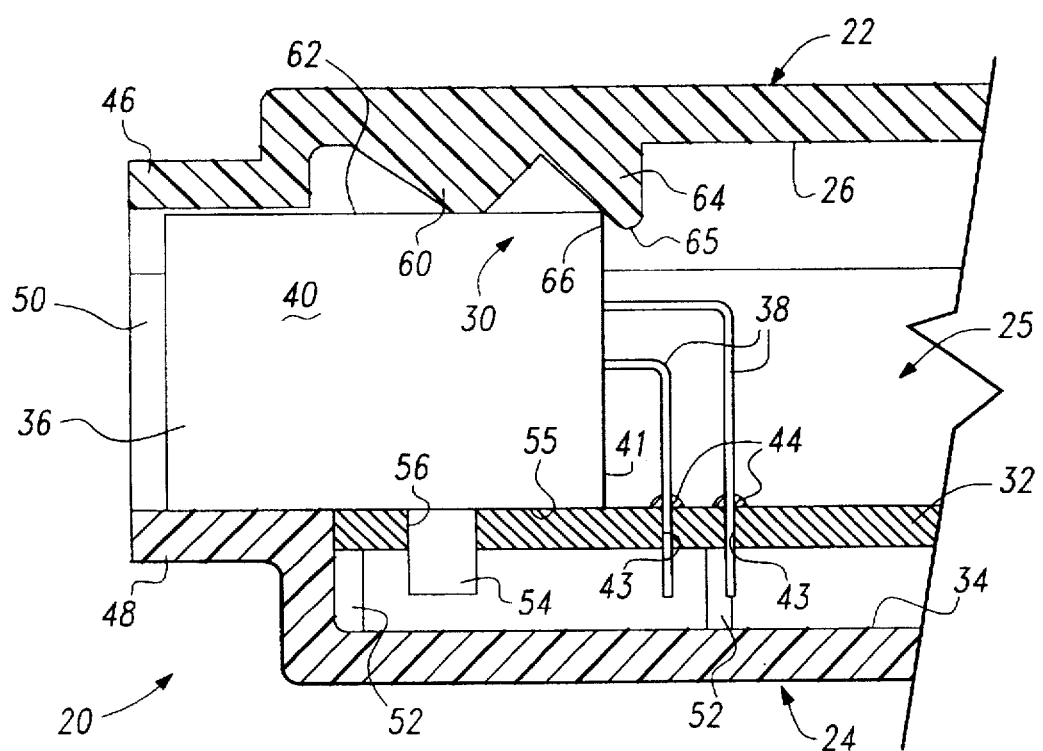
FIG. 2 is a partial, cross-sectional view of the connector assembly of FIG. 1.

As shown in FIG. 2, first member 22 and second member 24 each have a flange 46 and 48, respectively, which collectively define an opening 50 into housing 25. In the disclosed embodiment, second member 24 has a plurality of supports 52 extending from base 34. Circuit board 32 rests on supports 52 adjacent base 34 such that circuit board 32 is essentially parallel with base 34. Connector 36 has a tab 54 extending from a lower face 55 of main body 40. Lower face 55 abuts flange 48 and circuit board 32. Connector 36 thus rests on flange 48 and circuit board 32 and tab 54 extends through a hole 56 in circuit board 32.

As shown in FIG. 2, each rib set 28 and 30 includes a first rib 60 contacting an upper face 62 of connector main body 40. Rib 60 urges connector 36 against circuit board 32 and second member 24. Rib 60 opposes forces exerted on connector 36 primarily in a direction away from circuit board 32 and second member 24. A second rib 64 contacts a side face of body 40 at corner 66 and also urges connector 36 against circuit board 32 and second member 24. A tip 65 of ribs 64 extends beyond upper face 62. Rib 64 provides a stop, negating stress on connection 44 due to insertion forces exerted on connector 36 as described above. Thus, when an electrical connector is plugged into connector 36 through opening 50 (from the left in FIG. 2), rib 64 opposes the insertion force exerted on connector 36. As shown in FIG. 2, ribs 60 and 64 are preferably integral with first member 22 and preferably formed of a resilient material such as plastic or rubber.

As can be appreciated from FIG. 2, tab 54 is spaced from the location where contact arms 53 are secured 44 to the circuit board 32. Ribs 60 and 64 are positioned intermediate these two locations. Thus, the bias force on the component 36 tends to bias the contact arms 38 toward the circuit board 32.

Although an electrical connector is shown, it should be understood that the other types of electrical components may be secured to circuit boards using the inventive structure.

A preferred description of this invention has been disclosed; however, a worker of ordinary skill in the art would recognize that certain modifications would come within the scope of this invention. For that reason, the following claims should be studied in order to determine the true scope and content of this invention.

We claim:

1. An electrical assembly comprising:
   a first member having an inner face and at least one rib extending from said inner face;
   a second member, said first and second members attached to each other forming a housing with an opening;
   a circuit board disposed in said second member; and
   an electrical connector disposed in said housing, said connector having at least one contact arm contacting said circuit board, wherein said rib contacts said connector and urges a portion of said connector which includes said contact arm, against said circuit board.

2. An assembly as recited in claim 1, wherein said at least one rib is at least two ribs extending from said inner face, a first of said ribs contacting an upper face of said connector and a second of said ribs contacting a side face of said connector.

3. An assembly as recited in claim 2, said second rib contacting said side face at a corner of said upper face and said side face.

4. An assembly as recited in claim 1, wherein each of said at least one contact arm passes through a hole in said circuit board and is soldered to said circuit board.

5. An assembly as recited in claim 1, wherein said connector includes a tab which extends from a main body of said connector into a hole in said circuit board.

6. An electrical assembly comprising:
   a first member having an inner face and at least one rib extending from said inner face;
   a second member, said first and second members attached to each other forming a housing with an opening;
   a circuit board disposed in said second member
   an electrical connector disposed in said housing, said connector having at least one contact arm contacting said circuit board, wherein said rib contacts said connector and urges said connector against said circuit board; and
   said rib contacts a side face of said connector, said rib defining a stop for said connector against insertion forces.

7. An assembly as recited in claim 6, wherein said rib contacts said side face at a corner of said side face and an upper face.

8. An electrical assembly comprising:
   a first member having an inner face and a rib extending from said inner face;
   a second member, said first and second members forming a housing;
   a circuit board disposed in said second member;
   an electrical component disposed in said housing, said component having at least one contact arm contacting said circuit board, wherein said rib contacts said component urging said component against said circuit board; and
   said component including a tab which extends from a main body of said component at a location spaced from said at least one contact arm, and said tab extending into a hole in said circuit board, said rib contacting said component at a location intermediate said tab and a location where said contact arm contacts said circuit board.

9. An electrical assembly as recited in claim 8, wherein said rib has a tip extending beyond an upper face of said component, said rib contacting a corner of said component, defining a stop against insertion forces.

10. An electrical assembly as recited in claim 8, wherein said rib comprises a resilient material and is integral with said first member.

11. An electrical assembly as recited in claim 8, wherein said component is an electrical connector.

12. An electrical assembly as recited in claim 11, wherein each of said first member and said second member has a flange, said flanges collectively defining an opening through which a mating component is plugged into said connector, and said connector abutting said second member flange and said circuit board, said rib urging said connector against said circuit board and said second member flange.

13. An electrical assembly as recited in claim 8, wherein each of said at least one contact arm passes through said hole in said circuit board and is soldered to said circuit board.

14. An electrical assembly comprising:
   a first member having an inner face and a pair of ribs extending from said inner face;
   a second member, said first and second members attached to each other forming a housing with an opening;
   a circuit board disposed in said second member; and
   an electrical connector disposed in said housing, said connector having a plurality of contact arms contacting said circuit board, wherein a first of said ribs contacts an upper face of said connector and a second of said ribs contacts a corner of said connector, said ribs urging said connector against said circuit board.

15. An assembly as recited in claim 14, wherein said second rib defines a stop for said connector against insertion forces for a mating electrical component.

16. An assembly as recited in claim 14, wherein each of said first member and said second member has a flange, said flanges collectively defining said opening through which a mating electrical component is plugged into said connector, and said connector abutting said second member flange and said circuit board, said pair of rib urging said connector against said circuit board and said second member flange.

17. An assembly as recited in claim 14, wherein said ribs are integrally formed with said first member.

18. An assembly as recited in claim 14, wherein each of said contact arms passes through a hole in said circuit board and is soldered to said circuit board.

19. An assembly as recited in claim 14, wherein said connector includes a tab which extends from a main body of said connector into a hole in said circuit board.

* * * * *